United States Patent
Nakano

(10) Patent No.: US 7,547,946 B2
(45) Date of Patent: Jun. 16, 2009

(54) MOS SEMICONDUCTOR DEVICE WITH LOW ON RESISTANCE

(75) Inventor: Masaji Nakano, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 398 days.

(21) Appl. No.: 11/377,732

(22) Filed: Mar. 17, 2006

(65) Prior Publication Data

US 2006/0214693 A1 Sep. 28, 2006

(30) Foreign Application Priority Data

Mar. 24, 2005 (JP) .............................. 2005-087252

(51) Int. Cl.
*H01L 29/78* (2006.01)
(52) U.S. Cl. ................ 257/341; 257/401; 257/E29.134
(58) Field of Classification Search ................ 257/213, 257/341, 342, 401, E29.134
See application file for complete search history.

(56) References Cited

U.S. PATENT DOCUMENTS

| | | | | |
|---|---|---|---|---|
| 6,159,841 A * | 12/2000 | Williams et al. | ............ | 438/619 |
| 6,917,091 B2 * | 7/2005 | Inoue et al. | .................. | 257/502 |
| 6,927,458 B2 * | 8/2005 | Worley | ........................ | 257/361 |
| 7,015,545 B2 * | 3/2006 | McKay et al. | .............. | 257/341 |
| 7,166,898 B2 * | 1/2007 | Briere | ......................... | 257/401 |
| 2002/0105009 A1 * | 8/2002 | Eden et al. | ................... | 257/138 |

FOREIGN PATENT DOCUMENTS

JP 61-51754 U 4/1986

* cited by examiner

*Primary Examiner*—Jerome Jackson, Jr.
*Assistant Examiner*—Paul A Budd
(74) *Attorney, Agent, or Firm*—Sughrue Mion, PLLC

(57) ABSTRACT

The semiconductor device 1 includes transistors 10, 20. Each of the transistors 10 (first transistor) is a MOSFET, and includes source regions 102, 106, a drain region 104, and a gate electrode 110. Each of the transistors 20 (second transistor) is also a MOSFET, and includes source regions 202, 206, a drain region 204, and a gate electrode 210. The source region 106 of the transistor 10 and the source region 202 of the transistor 20 are the identical region in the semiconductor substrate 90. In other words, the source region 106 and the source region 202 are shared by the both transistors.

6 Claims, 11 Drawing Sheets

MOS SEMICONDUCTOR DEVICE WITH LOW ON RESISTANCE

This appilication is based on Jappanese patent Application No. 2005-087252, the content of witch is Incorporated herinto by reference.

BACKGROUND

1. Technical Field

The present invention relates to a semiconductor device.

2. Related Art

Semiconductor devices so far developed include the one disclosed in Japanese Laid-open utility model publication No. S61-51754. In the semiconductor device according to this publication, each of a plurality of regions in a single chip includes a power transistor.

SUMMARY OF THE INVENTION

The semiconductor device according to the publication, however, still has a room for improvement in reduction in current density at the source electrode or the drain electrode of the power transistors, as well as in lowering a peak temperature of the power transistors.

According to the present invention, there is provided a semiconductor device comprising: (a) a first transistor including a first source/drain region, a second source/drain region located opposite to the first source/drain region across a first gate region, a third source/drain region located opposite to the second source/drain region across a second gate region and electrically connected to the first source/drain region, and a first gate electrode provided in each of the first and second gate regions; and (b) a second transistor including the third source/drain region, a fourth source/drain region located opposite to the third source/drain region across a third gate region, a fifth source/drain region located opposite to the fourth source/drain region across a fourth gate region and electrically connected to the first and third source/drain regions, and a second gate electrode provided in each of the third and fourth gate regions, and independently controlled from the first gate electrode.

In the semiconductor device thus constructed, when the first, third and fifth source/drain regions are acting as the source, the second and fourth source/drain regions act as the drain. On the contrary, when the former acts as the drain, the latter acts as the source. Under such configuration, the third source/drain region is shared by the first and second transistors. Accordingly, the first and second transistors share either of the source or drain, which allows reducing current density at the source electrode or drain electrode of each transistor. Further, heat is generated over a more extensive area during the operation than in a device where neither the source nor drain is shared, which leads to the lower peak temperature of each transistor.

Thus, the present invention provides a semiconductor device capable of reducing current density at a source electrode or a drain electrode of each transistor, and lowering the peak temperature of each transistor.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
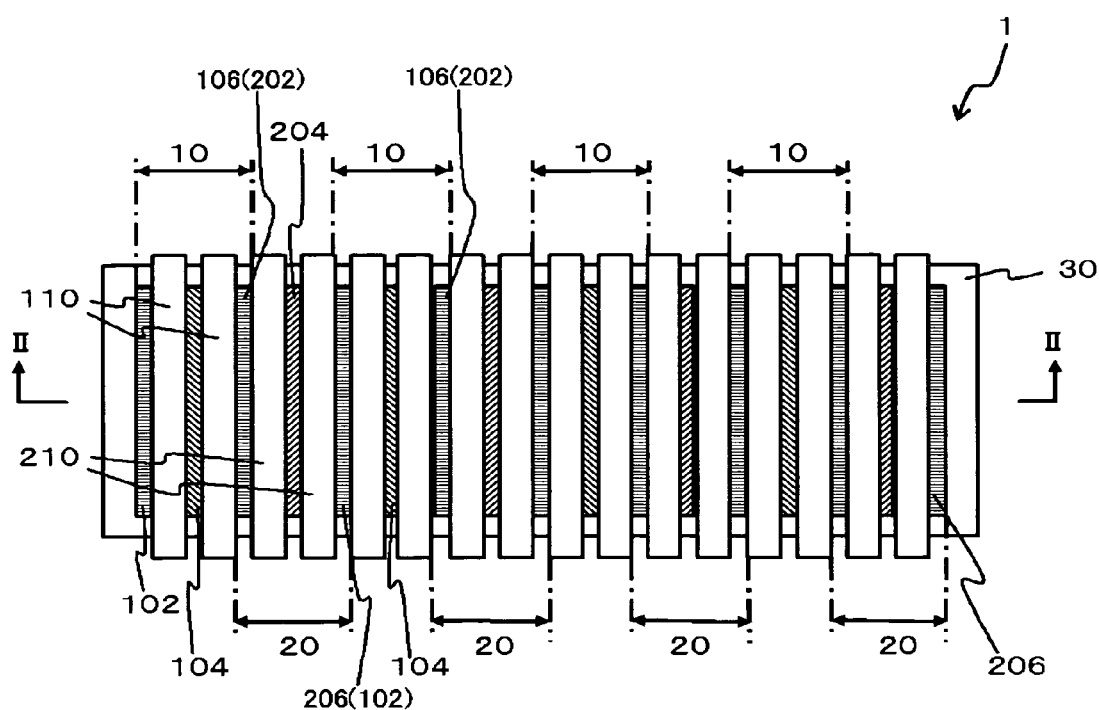
FIG. 1 is a plan view showing a semiconductor device according to the first embodiment of the present invention.

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a semiconductor device according to the present invention will be described in details, referring to the accompanying drawings. In the drawings, same constituents will be given identical numerals, and duplicating description will be omitted.

First Embodiment

Figure 2:
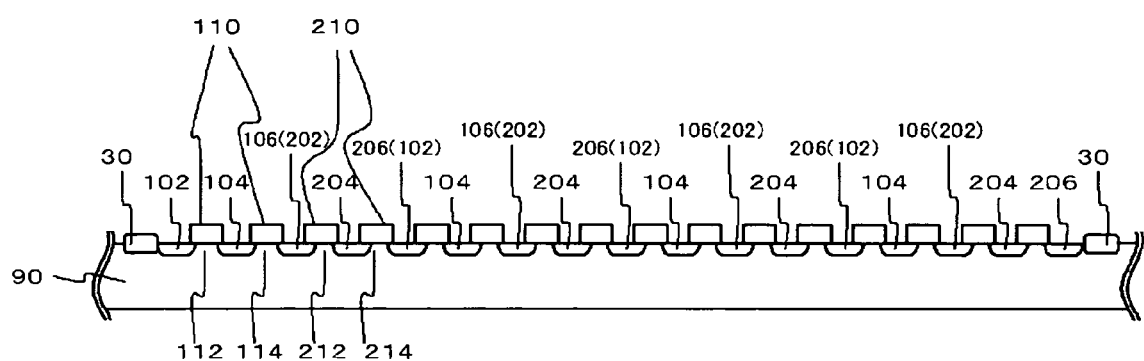
FIG. 2 is a cross-sectional view taken along the line II-II of FIG. 1.

FIG. 1 is a plan view showing a semiconductor device according to the first embodiment of the present invention. FIG. 2 is a cross-sectional view taken along the line II-II of FIG. 1. The semiconductor device 1 includes transistors 10, 20.

In this embodiment, the semiconductor device 1 includes a plurality (in this case, four each) of transistors 10, 20. The transistors 10, 20 are alternately aligned in a transverse direction according to the orientation of FIG. 1. Also, as is apparent from FIG. 2, the transistors 10, 20 are located in a device-forming region surrounded by an isolation region 30 formed in a semiconductor substrate 90. Accordingly, the transistors 10 and the transistors 20 are continuously disposed in the semiconductor device 1, without being isolated by the isolation region 30. The semiconductor substrate 90 may be a silicon substrate, for example. The isolation region 30 may be a LOCOS region.

Each of the transistors 10 (first transistor) is a MOSFET, and includes source regions 102, 106, a drain region 104, and a gate electrode 110. The source region 102 (first source/drain region), the drain region 104 (second source/drain region) and the source region 106 (third source/drain region) are aligned in this sequence with a predetermined interval therebetween. The source region 102, drain region 104, and the source region 106 are also aligned in a transverse direction in FIG. 1. Accordingly, the alignment direction of the source regions 102, 106 and the drain region 104 is the same as that of the transistors 10, 20.

Referring to FIG. 2, a region disposed between the source region 102 and drain region 104 constitutes the gate region 112 (first gate region), and a region disposed between the drain region 104 and the source region 106 constitutes the gate region 114 (second gate region). In other words, the drain region 104 is located opposite to the source region 102 across the gate region 112 interposed therebetween, and the source region 106 is located opposite to the drain region 104 across the gate region 114 interposed therebetween. The source region 102 and the source region 106 are electrically connected to each other. On each of the gate regions 112, 114, a gate electrode 110 (first gate electrode) is provided, via a gate oxide film (not shown) disposed therebetween.

Each of the transistors 20 (second transistor) is also a MOSFET, and includes source regions 202, 206, a drain region 204, and a gate electrode 210. The source region 202 (third source/drain region), the drain region 204 (fourth source/drain region) and the source region 206 (fifth source/drain region) are aligned in this sequence with a predetermined interval therebetween. The source region 202, the drain region 204, and the source region 206 are also aligned in the same alignment direction as that of the transistors 10, 20. The source regions 102, 106 (202), 206 constitute a first source/drain region group. The drain regions 104, 204 constitute a second source/drain region group. Either of the first or second source/drain region group acts as the source region, while the other acts as the drain region.

Referring again to FIG. 2, a region disposed between the source region 202 and drain region 204 constitutes the gate region 212 (third gate region), and a region disposed between the drain region 204 and the source region 206 constitutes the gate region 214 (fourth gate region). In other words, the drain region 204 is located opposite to the source region 202 across the gate region 212 interposed therebetween, and the source region 206 is located opposite to the drain region 204 across the gate region 214 interposed therebetween. The source region 202 and the source region 206 are electrically connected to each other. On each of the gate regions 212, 214, a gate electrode 210 (second gate electrode) is provided, via a gate oxide film (not shown) disposed therebetween. The gate electrodes 110, 210 are independently controlled from each other.

As is apparent from FIGS. 1 and 2, the source region 106 of the transistor 10 and the source region 202 of the transistor 20 are the identical region in the semiconductor substrate 90. In other words, the source region 106 and the source region 202 are shared by the both transistors. Because of such configuration, the source region 102, the source region 106 (202) and the source region 206 are electrically connected to one another.

Likewise, the source region 102 of the transistor 10 and the source region 206 of the transistor 20, located on the side of the source region 102 of the same transistor 10 (i.e. at the left in FIG. 1) are shared by the both transistors. Thus, the transistor 10 shares the source region 102 (206) with the adjacent transistor 20 on the side of the source region 102, and also the source region 106 (202) with another adjacent transistor 20 on the side of the source region 106. From the standpoint of the transistor 20 equally, the transistor 20 shares the source region 202 (106) with the adjacent transistor 10 on the side of the source region 202, and also the source region 206 (102) with another adjacent transistor 10 on the side of the source region 206.

Figure 3:
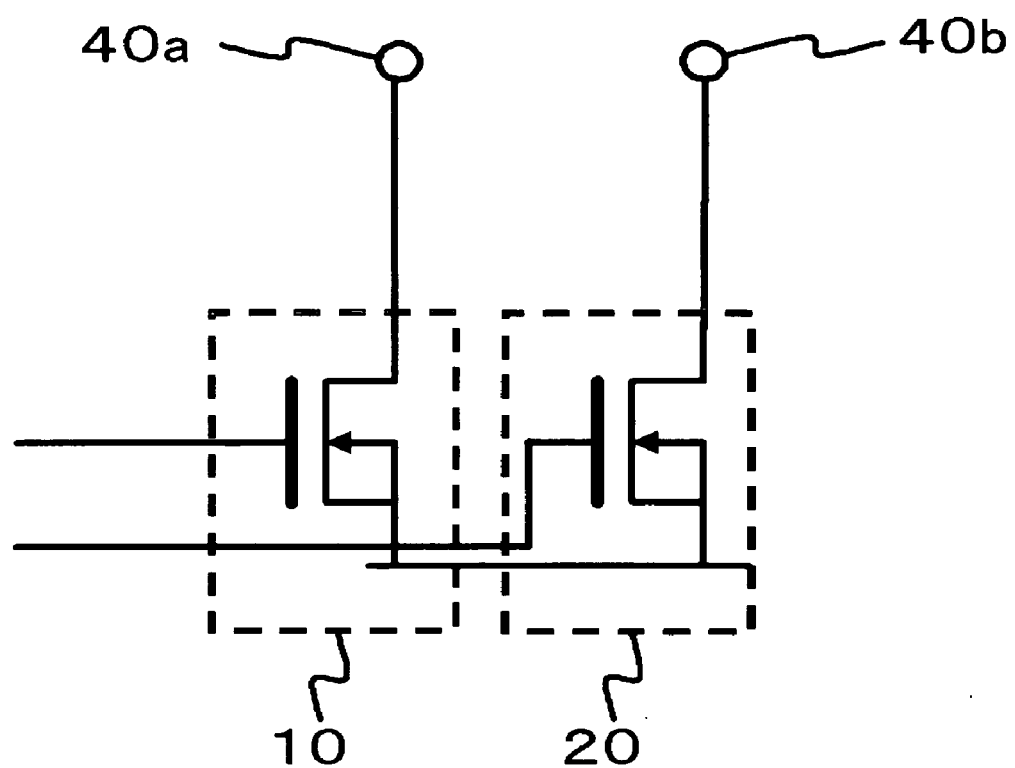
FIG. 3 is a circuit diagram showing a circuit equivalent to the semiconductor device of FIG. 1.

FIG. 3 is a circuit diagram showing a circuit equivalent to the semiconductor device 1. In the circuit shown in FIG. 3, the source is shared by the transistor 10 and the transistor 20. The drains of the transistors 10, 20 are connected to output terminals 40a, 40b respectively. The gates of the transistors 10, 20 are connected to a predriver (not shown), and independently controlled from each other by the predriver.

Figure 4:
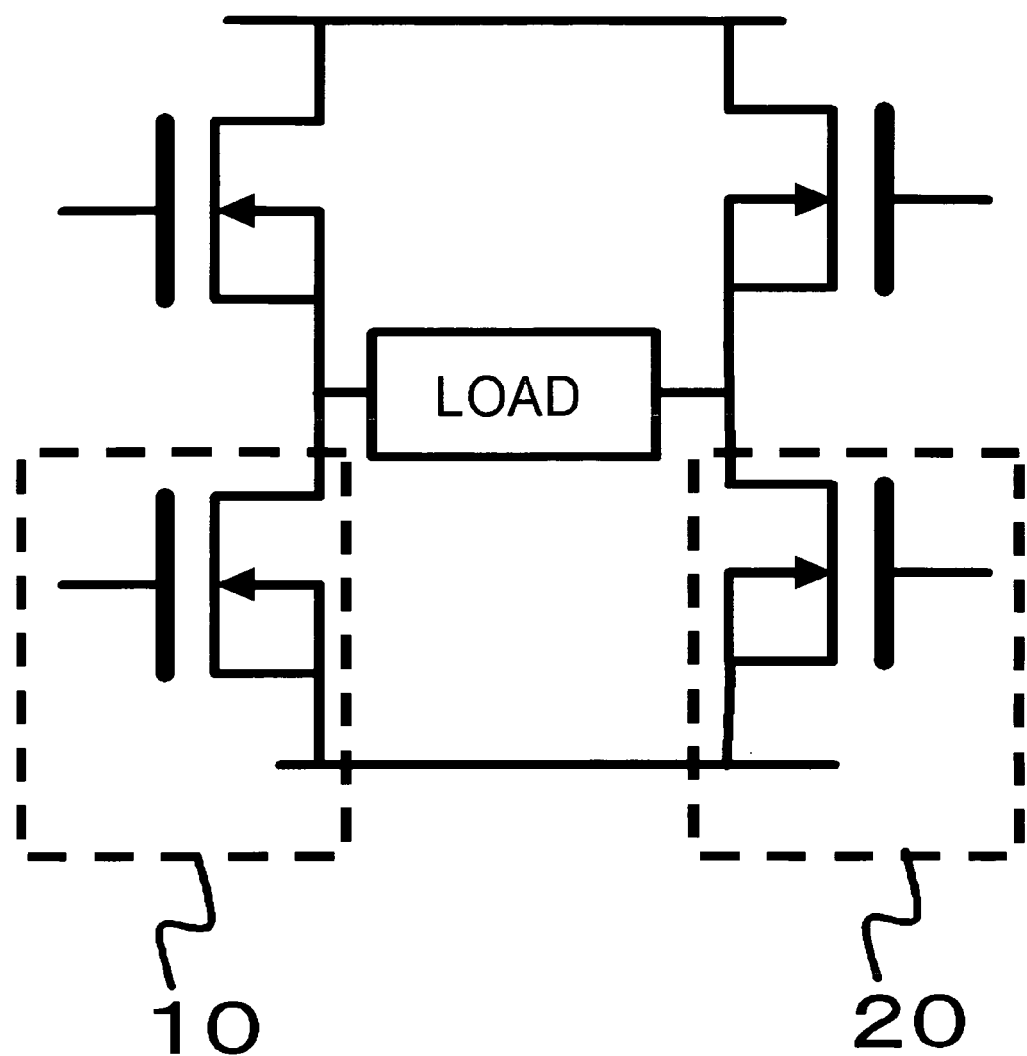
FIG. 4 is a circuit diagram for explaining an application of the semiconductor device of FIG. 1.

The semiconductor device 1 thus configured may be appropriately applied to an H-bridge circuit as shown in FIG. 4. In FIG. 4, the transistors 10, 20 respectively serve as each of two low-side transistors. In this example, naturally, the transistors 10, 20 are controlled so that when the gate of either is turned ON, the gate of the other is turned OFF.

The semiconductor device 1 offers the following advantages. In the semiconductor device 1, the source region 106 of the transistor 10 and the source region 202 of the transistor 20 are shared by the both transistors. Since the transistor 10 and the transistor 20 thus share the source region, an increase in source potential caused by a resistance component of the source electrode can be suppressed. This results in reduction in ON resistance in the semiconductor device 1.

Figure 11:
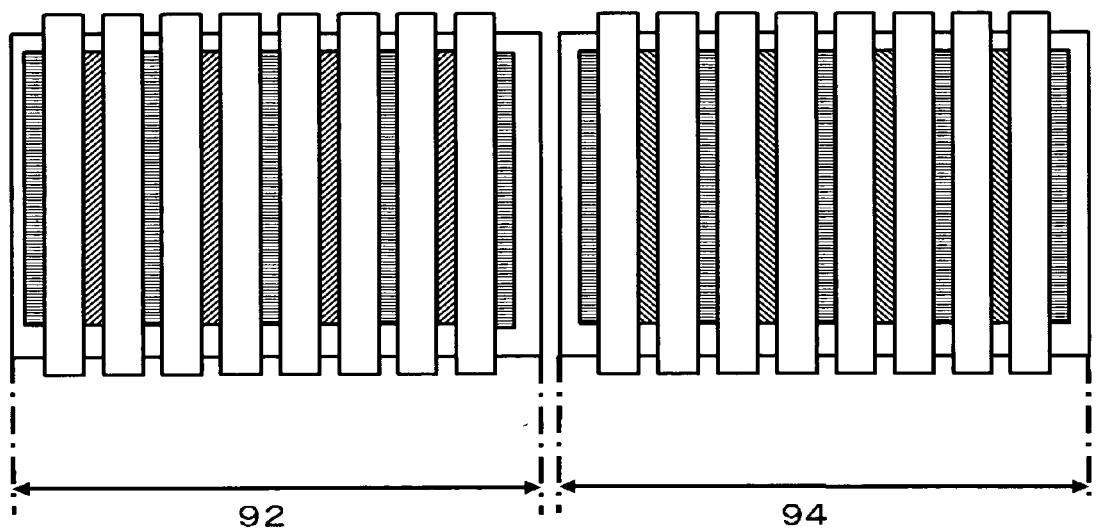
FIG. 11 is a plan view showing a semiconductor device according to a comparative example.

FIG. 11 is a plan view showing a semiconductor device according to a comparative example. In FIG. 11, two transistors 92, 94 are respectively located in different device-forming regions, so that the transistors 92, 94 share neither of the source nor the drain. In such semiconductor device, when the transistor 92 is ON and the transistor 94 is OFF for example, naturally neither the source nor the drain of the transistor 94 serves to supply a current. Accordingly, a current only runs through the source and the drain of the transistor 92. This also applies to the semiconductor device disclosed in the Japanese Laid-open utility model publication No. S61-51754.

On the other hand in the semiconductor device 1, even when only one of the transistors 10, 20 is ON, the source of the both transistors 10, 20 supplies a current, since the source is shared by the transistors 10, 20. Accordingly, an increase in source potential is suppressed, and hence the ON resistance is reduced, unlike in the semiconductor device according to the comparative example.

Further, current density at the source electrode is reduced in the semiconductor device 1, which permits designing the source electrode in a finer width. The reduction in current density at the source electrode is particularly beneficial when utilizing the transistors 10, 20 as a power transistor.

Figure 5A:
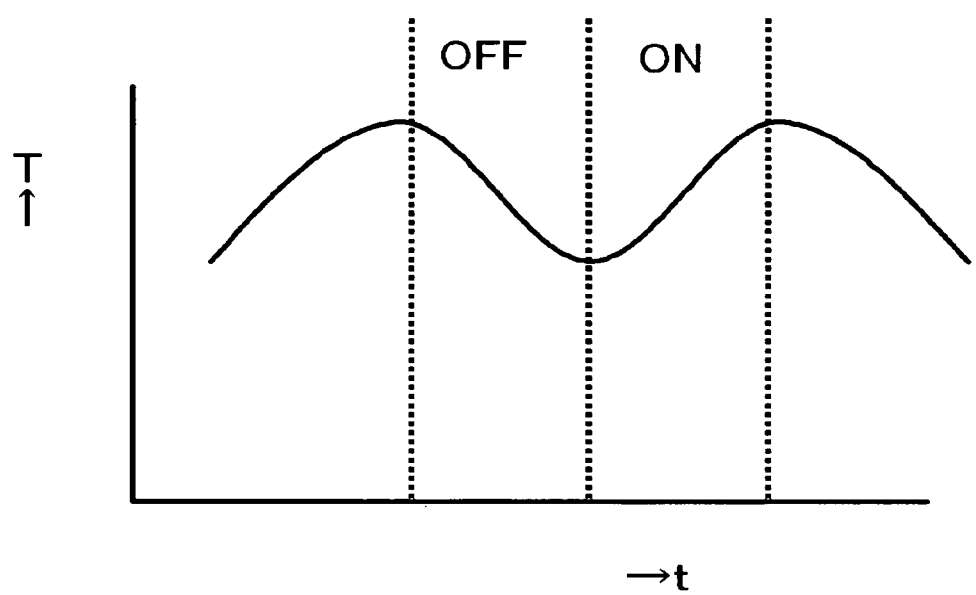
FIGS. 5A and 5B are graphs for explaining the advantageous effect of the semiconductor device of FIG. 1.

Further, in the semiconductor device 1, heat is generated over a more extensive area during the operation, than in the semiconductor device according to the comparative example. This leads to a lower peak temperature of the transistors 10, 20. As an example, it is assumed here that the transistors 92, 94 are alternately turned ON and OFF in the semiconductor device of FIG. 11, i.e. when one is ON the other is OFF. In this case, the pellet temperature of the transistor 92 rises while the transistor 92 is ON and falls while transistor 92 is OFF in general, as shown in FIG. 5A. This also applies to the pellet temperature of the transistor 94. Here, the peak temperature refers to the highest temperature in FIG. 5A.

Figure 5B:
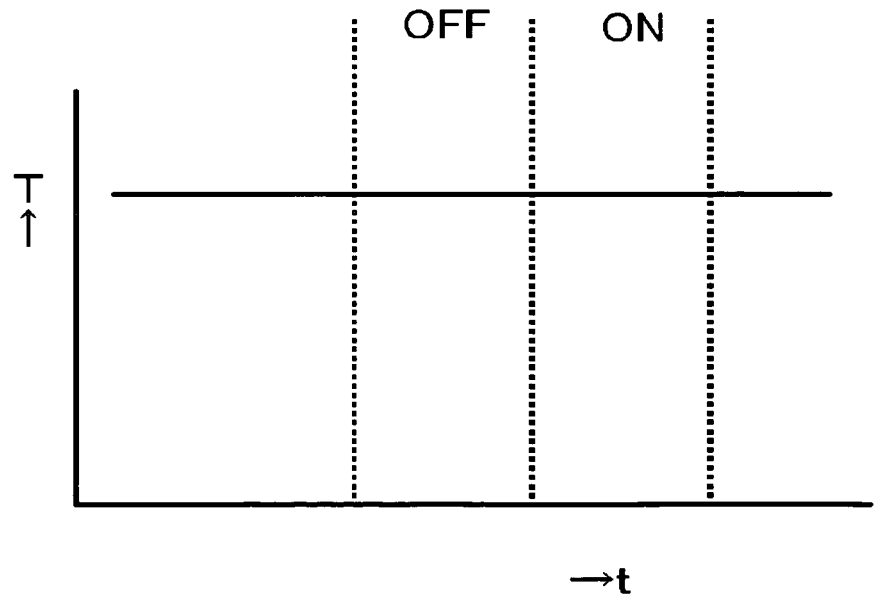

In contrast, it is now assumed that the transistors 10, 20 in the semiconductor device 1 are alternately turned ON and OFF. In this case, the pellet temperature of the transistor 10 is leveled off with the temperature of the transistor 20, so that fluctuation in temperature is restrained as shown in FIG. 5B. This also applies to the pellet temperature of the transistor 20. Thus, the semiconductor device 1 can lower the peak temperature of the transistors 10, 20.

In this embodiment, a plurality of transistors 10, 20 is respectively provided, so that the source region 102 of the transistor 10 and the source region 206 of the adjacent transistor 20 on the side of the source region 102 of the transistor 10 are shared by both transistors. Such configuration more prominently achieves the advantage of reducing the ON resistance and lowering the peak temperature. It is not, however, imperative to provide a plurality of the respective transistors 10, 20. For example, just one each of the transistors 10 and 20 may be provided, or one of either and a plurality of the other may be provided.

The transistors 10, 20 are disposed inside a single device-forming region surrounded by the isolation region 30. Such configuration facilitates achieving a structure where the transistor 10 and the transistor 20 share the source region.

When a device is to be controlled so that when one of the gate electrodes 110, 210 is turned ON, the other is turned OFF, the semiconductor device 1 configured as above is particularly beneficial. When such control is performed in the semiconductor device of FIG. 11, only one of the transistors 92, 94 at maximum supplies a current to the source/drain region, at all times. In contrast in the semiconductor device 1, as already described, the transistor that is OFF also supplies a current. Such operation more prominently achieves the advantage of reducing the ON resistance and lowering the peak temperature, in comparison with the semiconductor device of FIG. 11.

Second Embodiment

Figure 6:
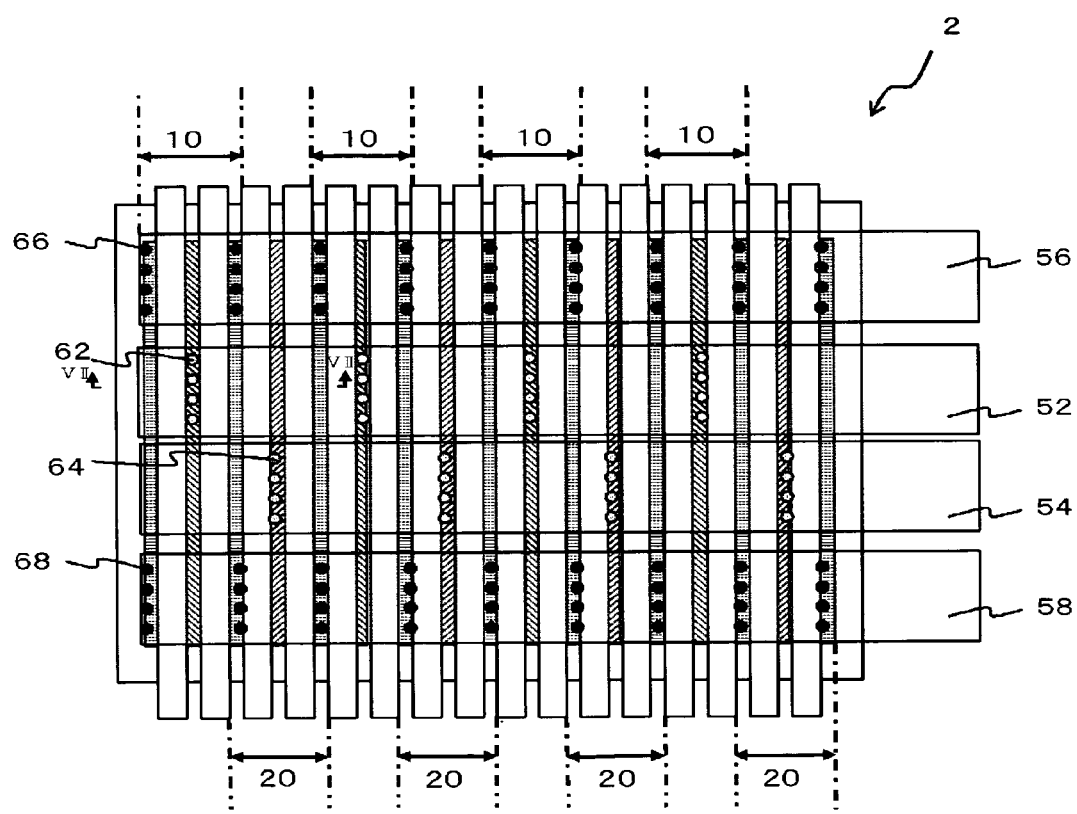
FIG. 6 is a plan view showing a semiconductor device according to the second embodiment of the present invention.
Figure 7:
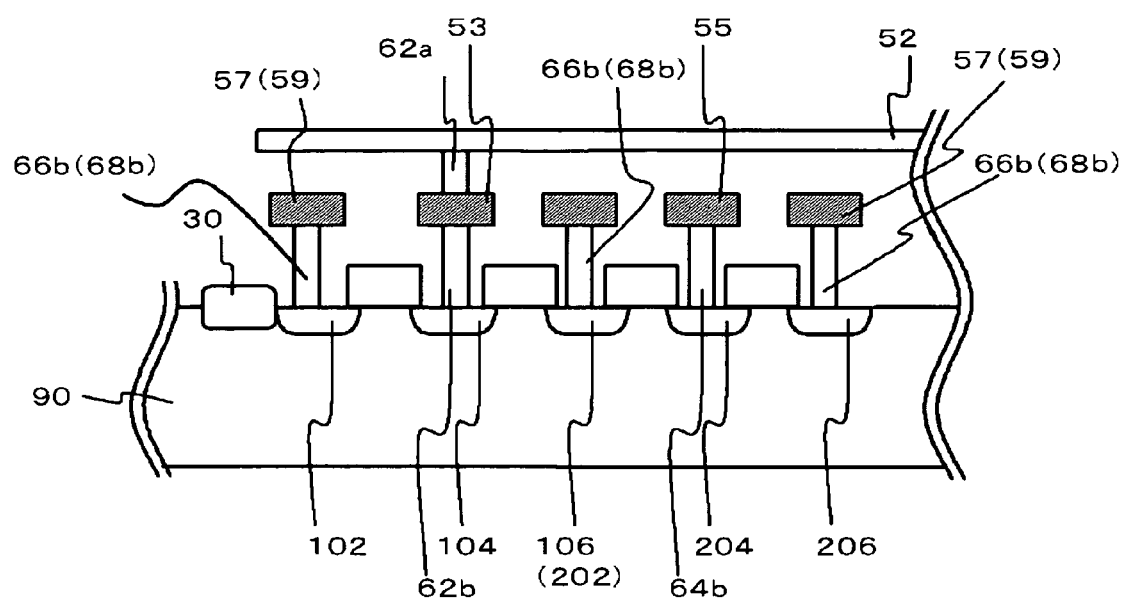
FIG. 7 is a cross-sectional view taken along the line VII-VII of FIG. 6.

FIG. 6 is a plan view showing a semiconductor device according to the second embodiment of the present invention. FIG. 7 is a cross-sectional view taken along the line VII-VII of FIG. 6. The semiconductor device 2 includes transistors 10, 20, drain interconnects 52, 54, and source interconnects 56, 58. The structure of the transistors 10, 20 is similar to that in the semiconductor device 1. In the semiconductor device 2 also, a plurality of the respective transistors 10, 20 is alternately aligned, as in the semiconductor device 1.

The drain interconnects 52, 54 and the source interconnects 56, 58 are disposed so as to extend along the alignment direction of the transistors 10, 20. These interconnects are disposed in the sequence of the source interconnect 56, the drain interconnect 52, the drain interconnect 54 and the source interconnect 58, in a direction generally orthogonal to the alignment direction. In other words, adjacent to the drain interconnect 52, the drain interconnect 54 is located. Also, adjacent to the drain interconnect 52 on the opposite side to the drain interconnect 54, the source interconnect 56 is disposed. Further, adjacent to the drain interconnect 54 on the opposite side to the drain interconnect 52, the source interconnect 58 is disposed.

The drain interconnect 52 (first source/drain interconnect) is electrically connected to the drain region 104 via a conductive plug 62. In this embodiment, the semiconductor device 2 is of a multilayer interconnect structure, so that the drain interconnect 52 and the drain region 104 are connected via a lower-layer interconnect 53, as shown in FIG. 7. The drain interconnect 52 and the interconnect 53 are connected through a via plug 62a, and the interconnect 53 and the drain region 104 are connected through a contact plug 62b. The conductive plug 62 above referred to represents an entirety that includes the via plug 62a and the contact plug 62b.

The drain interconnect 54 (second source/drain interconnect) is electrically connected to the drain region 204 via a conductive plug 64. The drain interconnect 54 and the drain region 204 are connected via a lower-layer interconnect 55. The drain interconnect 54 and the interconnect 55 are connected through a via plug (not shown), and the interconnect 55 and the drain region 204 are connected through a contact plug 64b.

The source interconnect 56 (third source/drain interconnect) is electrically connected to the source regions 102, 106, 202, 206 via a conductive plug 66. The source interconnect 56 and the respective source regions are connected via a lower-layer interconnect 57. The source interconnect 56 and the interconnect 57 are connected through a via plug (not shown), and the interconnect 57 and the respective source regions are connected through a contact plug 66b.

The source interconnect 58 (fourth source/drain interconnect) is electrically connected to the source regions 102, 106, 202, 206 via a conductive plug 68. The source interconnect 58 and the respective source regions are connected via a lower-layer interconnect 59. The source interconnect 58 and the interconnect 59 are connected through a via plug (not shown), and the interconnect 59 and the respective source regions are connected through a contact plug 68b.

The semiconductor device 2 thus constructed further offers the following advantages, in addition to those achieved by the semiconductor device 1. Since the drain interconnect 52 and the source interconnect 56 are disposed adjacent to each other, the resistance therebetween can be suppressed. Likewise, since the drain interconnect 54 and the source interconnect 58 are disposed adjacent to each other, the resistance therebetween can be suppressed. Further, the source interconnects 56, 58 are located on an outer side of the drain interconnects 52, 54. Such layout allows sharing the source interconnects 56, 58 by the plurality of transistor groups, when these transistor groups are orthogonally disposed to the alignment direction of the transistors 10, 20 as shown in FIG. 6. The term of transistor group herein refers to a group that includes the transistors 10, 20 disposed along the alignment direction.

Third Embodiment

Figure 8:
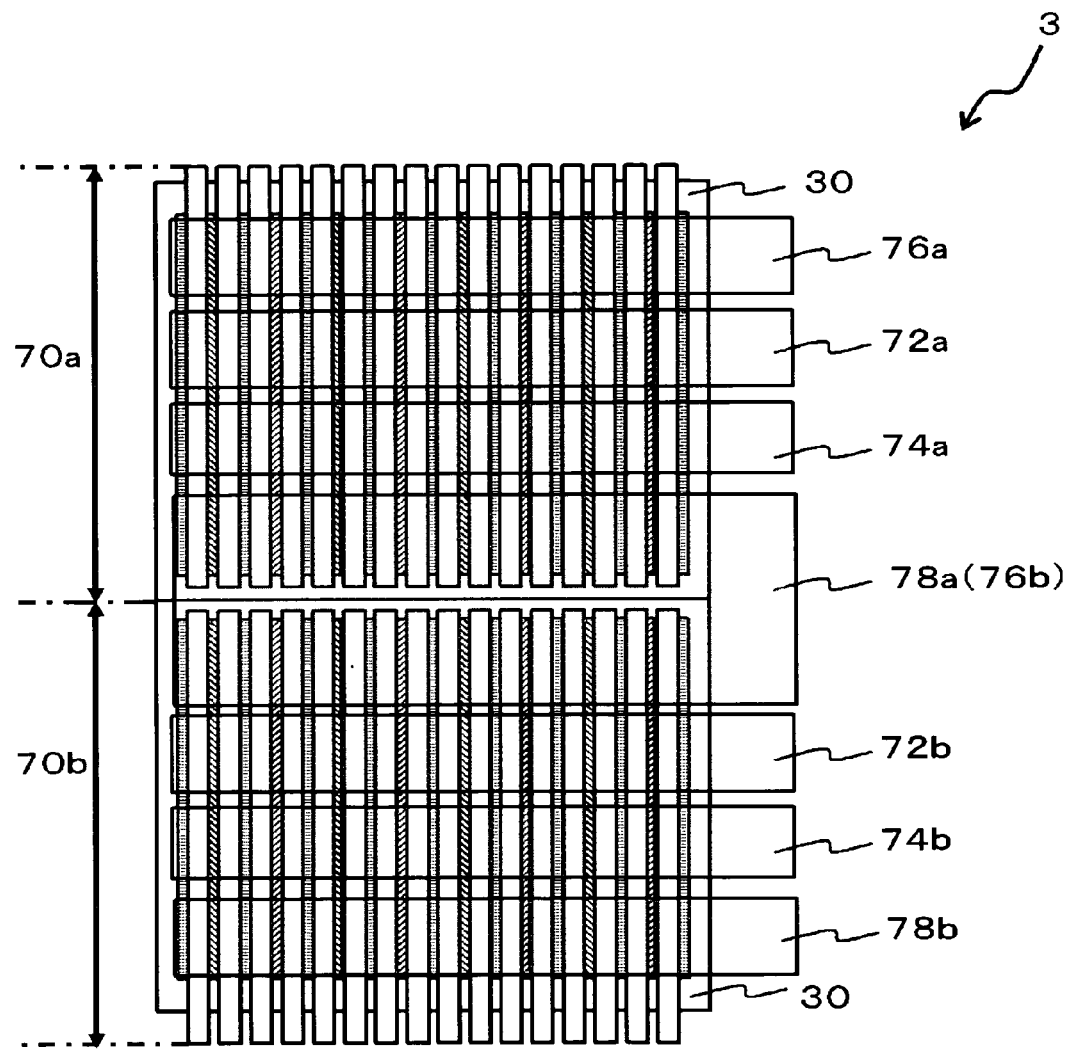
FIG. 8 is a plan view showing a semiconductor device according to the third embodiment of the present invention.

FIG. 8 is a plan view showing a semiconductor device according to the third embodiment of the present invention. The semiconductor device 3 includes a plurality (in this embodiment, two) of transistor groups 70a, 70b. The structure of the transistor groups 70a, 70b is similar to that described based on FIG. 1. The transistor groups 70a, 70b are aligned in a vertical direction according to the orientation of FIG. 8. Accordingly, the transistor groups 70a, 70b are aligned generally orthogonally to the alignment direction of the transistors 10, 20 in the transistor groups 70a, 70b. The transistor group 70a and the transistor group 70b are respectively located in different device-forming regions. Therefore, the transistor group 70a and 70b are isolated from each other by the isolation region 30.

Each gate electrode of the transistor groups 70a, 70b is independently controlled from one another. More specifically, the gate electrode 110 of the transistor group 70a (first transistor group) and the gate electrode 110 of the transistor group 70b (second transistor group) are independently controlled from each other, and the gate electrode 210 of the transistor group 70a and the gate electrode 210 of the transistor group 70b are independently controlled from each other. Accordingly in the semiconductor device 3, each of the four gate electrodes is independently controlled from one another.

The transistor group 70a includes drain interconnects 72a, 74a and source interconnects 76a, 78a. The structure of the interconnects 72a, 74a, 76a, 78a is similar to that of the interconnects 52, 54, 56, 58 in the semiconductor device 2.

Likewise, the transistor group 70b includes drain interconnects 72b, 74b and source interconnects 76b, 78b. The structure of the interconnects 72b, 74b, 76b, 78b is also similar to that of the interconnects 52, 54, 56, 58 in the semiconductor device 2.

Here, the source interconnect 78a and the source interconnect 76b are shared by the both transistor groups. The source interconnect 78a (76b) is disposed so as to span over the transistor groups 70a, 70b, thus to be electrically connected to the source regions 102, 106, 202, 206 of the transistor groups 70a, 70b.

Figure 9:
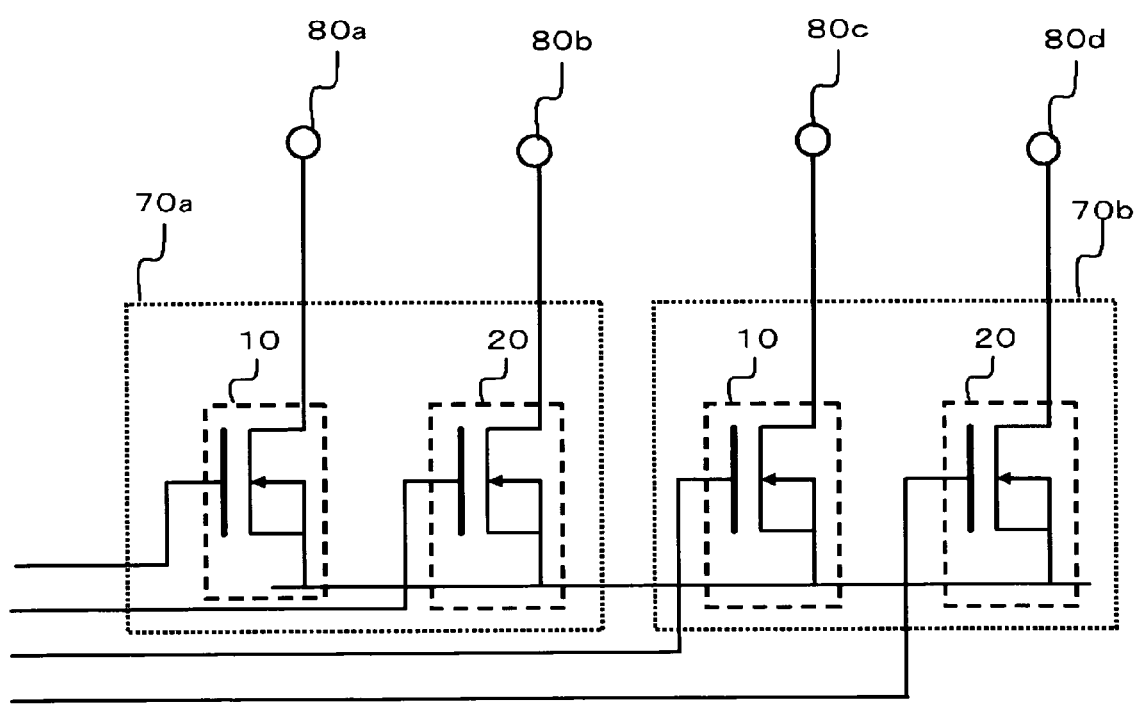
FIG. 9 is a circuit diagram showing a circuit equivalent to the semiconductor device of FIG. 8.

FIG. 9 is a circuit diagram showing a circuit equivalent to the semiconductor device 3. In the circuit shown therein, the transistors 10, 20 constituting the transistor group 70a and the transistors 10, 20 constituting the transistor group 70b share the source. The drains of these transistors are connected to output terminals 80a, 80b, 80c, 80d. The gates of these transistors are connected to a predriver (not shown), and independently controlled from one another by the predriver.

Figure 10:
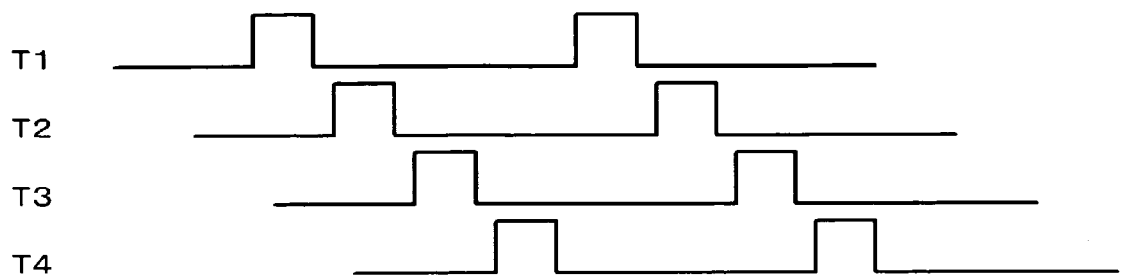
FIG. 10 is a timing chart for explaining a control method of each gate electrode in the semiconductor device of FIG. 8.

FIG. 10 is a timing chart for explaining a control method of gate electrodes in the semiconductor device of FIG. 8. T1 to T4 in FIG. 10 respectively represent a magnitude of the current at the output terminals 80a, 80c, 80b, 80d. In this embodiment, the transistors are controlled so that when any one of the plurality of transistors shown in FIG. 9 is turned ON, all the others are turned OFF. In other words, it is only one transistor at maximum, if any, that is turned ON during the operation of the semiconductor device 3. More specifically, when the transistor 10 of transistor group 70a is first turned OFF from an ON state, the transistor 10 of the transistor group 70b is turned ON. Then when the transistor 10 of the transistor group 70b is turned OFF, the transistor 20 of the transistor group 70a is turned ON. When the transistor 20 of the transistor group 70a is then turned OFF, the transistor 20 of the transistor group 70b is turned ON. When thereafter the transistor 20 of the transistor group 70b is turned OFF, a cycle is completed. After the completion of one cycle, the transistor 10 of the transistor group 70a is turned ON again, thus to repeat the foregoing cycle.

The semiconductor device 3 thus constructed further offers the following advantages, in addition to those achieved by the semiconductor devices 1 and 2. The semiconductor device 3 includes a plurality of transistor groups, so that the gate electrode of the respective transistor groups is independently controlled from one another. Such configuration allows constituting a multi-channel semiconductor device. In this embodiment actually, the semiconductor device 3 is a four-channel device as shown in FIG. 9. Naturally, three or more transistor groups may be provided, instead of two.

Further, the plurality of transistor groups is aligned generally orthogonally to the alignment direction of the transistors 10, 20 in each transistor group. Such configuration facilitates achieving a structure where the adjacent transistor groups can share the interconnect. Actually, in the semiconductor device 3 the transistor groups 70a, 70b share the source interconnect 78a (76b).

The semiconductor device according to the present invention is not limited to the foregoing embodiments, but various modifications may be made. For example, while the first, third and fifth source/drain regions are utilized as the source regions in the embodiments, the first, third and fifth source/drain regions may be utilized as the drain regions. In this case, the second and fourth source/drain regions are to serve as the source region. Still, since the transistor 10 and the transistor 20 share the drain, a drop of the drain potential caused by a resistance component of the drain electrode can be restricted, which results in reduction of the ON resistance.

It is apparent that the present invention is not limited to the above embodiment, and may be modified and changed without departing from the scope and spirit of the invention.

What is claimed is:

1. A semiconductor device comprising a plurality of first transistors and a plurality of second transistors;

each of said plurality of first transistors including a first source/drain region, a second source/drain region located opposite to said first source/drain region across a first gate region, a third source/drain region located opposite to said second source/drain region across a second gate region and electrically connected to said first source/drain region, and a first gate electrode provided in each of said first and second gate regions; and each of said plurality of second transistors including said third source/drain region, a fourth source/drain region located opposite to said third source/drain region across a third gate region, a fifth source/drain region located opposite to said fourth source/drain region across a fourth gate region and electrically connected to said first and third source/drain regions, and a second gate electrode provided in each of said third and fourth gate regions, and means for controlling said second gate electrode independently of said first gate electrode;

wherein said first and second transistors are alternately arranged; and said first source/drain region of said first transistor and said fifth source/drain region of said second transistor adjacent to said first transistor on the side of said first source/drain region are shared by said first and second transistors.

2. The semiconductor device according to claim 1, further comprising means for controlling the first and second gate electrodes so that when the first gate electrode is turned on, the second gate electrode is turned off.

3. The semiconductor device according to claim 1, wherein said first and second transistors are located in a single device-forming region surrounded by an isolation region.

4. A semiconductor device comprising:

a first transistor including a first source/drain region, a second source/drain region located opposite to said first source/drain region across a first gate region, a third source/drain region located opposite to said second source/drain region across a second gate region and electrically connected to said first source/drain region, and a first gate electrode provided in each of said first and second gate regions; and a second transistor including said third source/drain region, a fourth source/drain region located opposite to said third source/drain region across a third gate region, a fifth source/drain region located opposite to said fourth source/drain region across a fourth gate region and electrically connected to said first and third source/drain regions, and a second gate electrode provided in each of said third and fourth gate regions, and means for controlling said second gate electrode independently of said first gate electrode a first source/drain interconnect extending along an alignment direction of said first and second transistors, and electrically connected to said second source/drain region;
a second source/drain interconnect adjacent to said first source/drain interconnect, extending along said alignment direction, and electrically connected to said fourth source/drain region;
a third source/drain interconnect adjacent to said first source/drain interconnect on the opposite side to said second source/drain interconnect, extending along said alignment direction, and electrically connected to said first, third and fifth source/drain regions; and
a fourth source/drain interconnect adjacent to said second source/drain interconnect on the opposite side to said first source/drain interconnect, extending along said alignment direction, and electrically connected to said first, third and fifth source/drain regions.

5. The semiconductor device according to claim 4, comprising a plurality of transistor groups respectively including said first transistor and said second transistor;
further comprising means for controlling the gate electrodes of the transistor groups independently from one another.

6. The semiconductor device according to claim 5, wherein said plurality of transistor groups are aligned along a direction generally orthogonal to an alignment direction of said first and second transistors in each of said transistor groups.

* * * * *